US006440632B2

(12) United States Patent
Yasuda

(10) Patent No.: US 6,440,632 B2
(45) Date of Patent: Aug. 27, 2002

(54) PHOTOSENSITIVE RESIN COMPOSITION AND PROCESS FOR PRODUCING THE SAME

(75) Inventor: Tokugen Yasuda, Kyoto (JP)

(73) Assignee: Kansai Research Institute, Osaka (JP)

( * ) Notice: Subject to any disclaimer, the term of this patent is extended or adjusted under 35 U.S.C. 154(b) by 0 days.

(21) Appl. No.: 09/367,605

(22) PCT Filed: Dec. 10, 1998

(86) PCT No.: PCT/JP98/05597

§ 371 (c)(1),
(2), (4) Date: Aug. 18, 1999

(87) PCT Pub. No.: WO99/32935

PCT Pub. Date: Jul. 1, 1999

(30) Foreign Application Priority Data

Dec. 19, 1997 (JP) .............................. 9-351309
Jun. 22, 1998 (JP) ........................... 10-175129

(51) Int. Cl.[7] .......................... G03F 7/012; G03F 7/023
(52) U.S. Cl. ...................... 430/196; 430/191; 430/192; 430/193
(58) Field of Search ................................ 430/191, 192, 430/193, 196, 197, 326, 325

(56) References Cited

U.S. PATENT DOCUMENTS 4,797,348 A  * 1/1989 Nakamura et al. .......... 430/326

FOREIGN PATENT DOCUMENTS

| EP | 0 140 376 A2 | 5/1985 |
|----|--------------|--------|
| JP | 59-79248 | 5/1984 |
| JP | 62-70837 | 4/1987 |
| JP | 62-100751 | 5/1987 |
| JP | 62-249144 | 10/1987 |
| JP | 2-10345 | 1/1990 |
| JP | 3-253858 | 11/1991 |
| JP | 3-276156 | 12/1991 |
| JP | 5-127371 | 5/1993 |
| JP | 5-127385 | 5/1993 |
| JP | 7-36187 | 2/1995 |
| JP | 7-219216 | 8/1995 |
| JP | 9-288348 | 11/1997 |

* cited by examiner

Primary Examiner—John S. Y. Chu
(74) Attorney, Agent, or Firm—Pillsbury Winthrop LLP

(57) ABSTRACT

A photosensitive resin composition comprises a base resin (e.g., novolak resins, polyvinylphenol-series polymers), a first photoactive ingredient (e.g., diazobenzoquinone derivatives, diazonaphthoquinone derivatives) and a second photoactive ingredient (e.g., mixtures with azide compounds) each having an absorption range at wavelength $\lambda 1$ or $\lambda 2$, the wavelengths thereof being different from each other. Between the first and second photoactive ingredients, at least one photoactive ingredient is substantially inert at the absorption wavelength of the other. After exposing the photosensitive resin composition to a light to form a pattern, the whole surface of the photosensitive layer is exposed to a light of the other wavelength to make the surface hardly soluble (in the case a positive pattern is formed) or readily soluble (in the case a negative pattern is formed) in a developer, and developed, thereby forming a pattern of high resolution. Utilizing an existing exposure system, there can be obtained photosensitive resin compositions (especially, resists for semiconductor production) having improved sensitivity and resolution.

17 Claims, No Drawings

PHOTOSENSITIVE RESIN COMPOSITION AND PROCESS FOR PRODUCING THE SAME

TECHNICAL FIELD

The present invention relates to photosensitive resin compositions (resists) suitable for minute-processing of semiconductors by using ultraviolet rays or far-ultraviolet rays (including excimer laser and so on), a method for producing the same, and a method for forming patterns using the same.

BACKGROUND ART

There have been known compositions comprising an alkali-soluble novolak resin and a diazonaphthoquinone derivative as resists for semiconductors. These photosensitive resin compositions have been used as positive resists utilizing the characteristic that a diazonaphthoquinone group is decomposed upon irradiation with a light of 300 to 500 nm wavelength to form a carboxyl group, allowing the compositions to change from an alkali-insoluble state to an alkali-soluble state.

On the other hand, with a rise in the integration level of integrated circuits of semiconductors, the integrated circuits are getting minuter and minuter in recent years, and the formation of patterns in submicron order, quartermicron order, and smaller is now demanded. The most conventional method for achieving miniaturization or minuter integrated circuits is to use an exposure light of a shorter wavelength. For example, instead of using g-line (wavelength: 436 nm) or i-line (wavelength: 365 nm) of high-pressure mercury lamps generally used, a light source of a shorter wavelength such as KrF excimer laser (wavelength: 248 nm) and ArF excimer laser (wavelength: 193 nm) of next generation have already come into practical use.

However, the use of novolak resin/diazonaphthoquinone-type positive resists having been employed for the production of semiconductor integrated circuits using g-line or i-line leads to considerable deterioration in sensitivity and resolution even with KrF excimer laser or ArF excimer laser owing to the absorption ability of the novolak resin. Therefore, the novolak resin/diazonaphthoquinone-type positive resists are lacking in practicability.

Moreover, minute processing with KrF or ArF excimer laser has a number of technical problems to be solved with respect to the choice of, for example, light sources, exposing devices such as a lens system and photosensitive materials (resists). In addition, plant investment for applying the minute processing with KrF or ArF excimer laser to the practical production of semiconductors will be a vast sum of money.

Accordingly, an object of the present invention is to provide a photosensitive resin composition capable of largely improving sensitivity and resolution even with an existing apparatus (particularly, exposing system), a method for producing the same, and a method for forming patterns.

Another object of the present invention is to provide a photosensitive resin composition capable of largely improving the pattern profile and the focus latitude, a method for producing the same, and a method for forming patterns.

DISCLOSURE OF INVENTION

The inventors of the present invention made intensive investigations and found that the surface of a resist layer can be made hardly soluble or readily soluble by exposing the resist layer to a light of wavelength $\lambda 1$ or $\lambda 2$ through a mask patternwise, the resist layer being composed of a combination of a first photoactive ingredient active at an absorption wavelength $\lambda 1$ and a second photoactive ingredient which shows high absorption at wavelength $\lambda 2$, and then exposing all over the patterned surface to a light of wavelength $\lambda 2$ or $\lambda 1$ (hereinafter, referred to simply as "overall-exposure"), and that a pattern having a high γ-value and high resolution can be formed with high precision by developing the resist layer. The present invention has been achieved based on the above findings.

To summarize, the photosensitive resin composition of the present invention comprises a base resin and a photoactive component, and the photoactive component is constituted of a plurality of photoactive ingredients each having an absorption range at wavelength $\lambda 1$ or $\lambda 2$, the wavelengths thereof being different from each other. The base resin may be a novolak resin or polyvinylphenol-series polymer, and the photoactive component comprises a first photoactive ingredient having an absorption range at wavelength $\lambda 1$ and a second photoactive ingredient having an absorption range at wavelength $\lambda 2$. Usually, between the first and second photoactive ingredients, one of which is substantially inert at the absorption wavelength of the other. The first photoactive ingredient and the second photoactive ingredient may be a combination of, for example, a diazobenzoquinone derivative and/or diazonaphthoquinone derivative with an azide compound, a photoactive acid generator, or a photoactive acid generator and a crosslinking agent, or a combination of an azide compound and a photoactive acid generator.

The present invention includes a method for producing photosensitive resin compositions which comprises mixing a base resin with a plurality of photoactive ingredients each having an absorption range at wavelength $\lambda 1$ or $\lambda 2$, the wavelengths thereof being different from each other.

The present invention further includes a method for forming a pattern which comprises exposing the photosensitive resin composition to a light having a wavelength of either $\lambda 1$ or $\lambda 2$ to form a pattern, and exposing the entire surface of the pattern-exposed photosensitive resin composition to a light of the other wavelength.

In the present specification, "photoactive ingredients" are components generally referred to as photosensitizers, sensitizers, and so on, and are components which cause photoreactions by being activated or excited by light and take part in the formation of patterns. Regarding the photoactive ingredients, the term "wavelength" or "absorption wavelength" $\lambda 1$ or $\lambda 2$ means a wavelength at which the photoactive component is photosensitized and activated or excited by irradiation of a light of wavelength $\lambda 1$ or $\lambda 2$ and partakes in a photoreaction. Moreover, in the present specification, the term "absorption range" of a photoactive ingredient means an absorption wavelength range within which the absorption coefficient is not less than 1 (preferably not less than 10) at an exposing wavelength. The above "wavelength" or "absorption wavelength" $\lambda 1$ or $\lambda 2$ refers to an absorption range of the longest wavelength among the above absorption ranges.

BEST MODE FOR CARRYING OUT THE INVENTION

The species of the base resin can be selected according to which type of resist, positive or negative, is to be formed, and there may be exemplified phenol novolak resins, polyvinylphenol-series polymers, polymers having a non-aromatic ring such as a cycloalkyl group, polyvinyl alcohol-series polymers, acrylonitrile-series polymers, acrylamideseries polymers, polymers having a photodimerizable functional group such as cinnamoyl group and cinnamylidene group, nylon- or polyamide-series polymers, and polymerizable oligomers. When utilizing as a resist for semiconductor production, a novolak resin, a polyvinylphenol-series polymer and the like can be utilized as the base resin.

As the novolak resin, an alkali-soluble novolak resin is usually employed. When utilizing as a resist for semiconductor production, novolak resins conventionally employed in the field of resist can be used. A novolak resin can be obtained by condensing a phenol having at least one phenolic hydroxyl group in the molecule with an aldehyde in the presence of an acid catalyst. Examples of the phenol are, for example, $C_{1-4}$alkylphenols such as phenol, o-, m-, and p-cresols, 2,5-, 3,5-, and 3,4-xylenols, 2,3,5-trimethylphenol, ethylphenol, propylphenol, butylphenol, 2-t-butyl-5-methylphenol; dihydroxybenzenes; and naphthols. Examples of the aldehyde are aliphatic aldehydes such as formaldehyde, acetaldehyde, and glyoxal; and aromatic aldehydes such as benzaldehyde and salicylaldehyde.

These phenols can be used either singly or as a combination of two or more species, and the aldehydes can also be used singly or in combination. As the acid catalyst, there may be exemplified inorganic acids (e.g., hydrochloric acid, sulfuric acid, phosphoric acid), organic acids (e.g., oxalic acid, acetic acid, p-toluenesulfonic acid), and organic acid salts (e.g., divalent metal salts such as zinc acetate). The condensation reaction can be carried out according to a conventional method, e.g., at a temperature of about 60° C. to 120° C. for about 2 to 30 hours. The reaction may be conducted without a diluent or in a suitable solvent.

Any polyvinylphenol-series polymer can be used as the polyvinylphenol-series polymer provided that a vinylphenol is contained therein as a constitutive unit, and it may be a homopolymer or copolymer of a vinylphenol or a derivative thereof, or a copolymer with other copolymerizable monomer. The polyvinyl phenol-series polymer is preferably used with part of or all the phenolic hydroxyl groups contained therein protected by protecting groups. As the protecting groups, there may be mentioned, for example, alkyls (e.g., $C_{1-6}$alkyl groups, preferably $C_{1-4}$alkyl groups); cycloalkyl groups (e.g., cyclohexyl group); aryl groups (e.g., 2,4-dinitrophenyl group), aralkyl groups (e.g., benzyl groups that may have a substituent, such as benzyl group, 2,6-dichlorobenzyl group, 2-nitrobenzyl group, and triphenylmethyl group); tetrahydropyranyl group; non-polymerizable acyl groups [e.g., aliphatic acyl groups such as acetyl, propionyl, isopropionyl, butyryl, and isovaleryl groups (preferably, $C_{2-6}$acyl groups, particularly $C_{2-4}$aliphatic acyl groups); aromatic acyl groups such as benzoyl group (particularly, $C_{7-13}$aromatic acyl groups, and the like), and alicyclic acyl groups such as cyclohexylcarbonyl group]; alkoxycarbonyl groups (e.g., $C_{1-6}$alkoxy-carbonyl groups such as a t-butoxycarbonyl group); aralkyloxycarbonyl groups (e.g., benzyloxycarbonyl group); carbamoyl groups that may have a substituent (e.g., $C_{1-6}$alkyl groups, C6-14aryl groups) (e.g., carbamoyl, methylcarbamoyl, ethylcarbamoyl, phenylcarbamoyl groups); di$C_{1-4}$alkylphosphynothioyl groups; and diarylphosphynothioyl groups. The preferred protecting groups include alkyl groups, non-polymerizable acyl groups (particularly, aliphatic acyl groups), alkoxycarbonyl groups, and carbamoyl groups that may have a substituent.

The proportion of the protecting groups contained in the polyvinylphenol-series polymer is, for example, about 10 to 100 mole % and preferably about 20 to 70 mole % (e.g., 20 to 50 mole %), relative to the hydroxyl groups contained in the polymer.

The molecular weight of the polyvinylphenol-series polymer is not particularly restricted and can be selected from within the range of, for example, a weight average molecular weight of about 1,000 to 50,000 and preferably about 2,000 to 30,000 (e.g., 5,000 to 10,000).

The present invention is characterized in that a photoactive component is constituted of a plurality of photoactive ingredients each having an absorption range at wavelength $\lambda 1$ or $\lambda 2$, the wavelengths thereof being different from each other, and the photoactive component may be constituted of a first photoactive ingredient having an absorption range at wavelength $\lambda 1$ and a second photoactive ingredient having an absorption range at wavelength $\lambda 2$. Particularly, between the first and the second photoactive ingredients, it is advantageous that one ingredient is substantially inert at the absorption wavelength of the other and not involved in a photoreaction. Usually, the second photoactive ingredient does not show any absorption or is substantially inert at the absorption wavelength of the first photoactive ingredient. It is desirable that the first photoactive ingredient does not show any absorption, or is substantially inert at the absorption wavelength of the second photoactive ingredient. Moreover, although the absorption wavelength $\lambda 1$ of the first photoactive ingredient and the absorption wavelength $\lambda 2$ of the second photoactive ingredient can be selected according to the wavelength of the light source, it is usually advantageous that the difference between the absorption wavelengths is 30 to 450 nm, preferably about 50 to 400 nm, and more preferably about 70 to 350 nm. Further, when utilizing a conventional and practical exposure system, it is advantageous that the difference between the wavelengths $\lambda 1$ and $\lambda 2$ is about 100 to 300 nm (e.g., 100 to 280 nm).

One of the first photoactive ingredient and the second photoactive ingredient usually has an absorption wavelength $\lambda 1$ of 300 to 550 nm and preferably about 320 to 530 nm (e.g., 350 to 450 nm), and the other one usually has an absorption wavelength $\lambda 2$ of about 100 to 350 nm and preferably about 120 to 320 nm (e.g., 150 to 300 nm). The absorption wavelength of the second photoactive ingredient in many cases is shorter than that of the first photoactive ingredient. The absorption wavelength $\lambda 1$ of the first photoactive ingredient may usually be selected from within the range of about 300 to 550 nm, and the absorption wavelength $\lambda 2$ of the second photoactive ingredient may usually be selected from within the range of about 100 to 350 nm.

Moreover, to prevent a photoreaction from occurring deep down a photosensitive layer (resist film or layer) caused by overall exposure at wavelength $\lambda 1$ or $\lambda 2$ and allow the surface to absorb the light of $\lambda 1$ or $\lambda 2$, it is advantageous that a photoactive ingredient which is activated by the light for overall exposure (exposing the entire surface of the resist film or layer) has a high absorption constant at the wavelength of the exposure light. The molecular extinction coefficient $\epsilon$ of the second photoactive ingredient at wavelength $\lambda 1$ or $\lambda 2$ is usually about $1\times10^3$ to $5\times10^5$, preferably about $5\times10^3$ to $3\times10^5$, and more preferably about $1\times10^4$ to $3\times10^5$.

The first photoactive ingredient and the second photoactive ingredient can be selected, according to the type of the photosensitive resin (positive or negative), from conventional photosensitizers and sensitizers, such as diazonium salts (diazonium salts, tetrazonium salts, polyazonium salts); quinonediazides (e.g., diazobenzoquinone derivatives, diazonaphthoquinone derivatives); azide compounds; pyrylium salts; thiapyrylium salts; photodimerization sensitizers or photopolymerization initiators [e.g., ketones (anthraquinone, benzophenone, or derivatives thereof), benzoin ether or derivatives thereof]; and acid generators.

When utilizing as a positive photosensitive resin (particularly, a resist for semiconductor production), the first and second photoactive ingredients can be selected, according to the species of the photosensitive resin and the absorption ranges of patternwise exposure and overall exposure, from the above-mentioned photosensitizers and sensitizers (particularly, quinonediazides such as diazobenzoquinone and diazonaphthoquinone; azide compounds; acid generators; and the like) as a suitable combination. To be more concrete, when employing a novolak resin as the base resin, the first photoactive ingredient can be constituted of, for example, a diazobenzoquinone derivative and/or a diazonaphthoquinone derivative, and the second photoactive ingredient can be constituted of, for example, an azide compound, a photoactive acid generator, or a photoactive acid generator and a crosslinking agent. A compound that shows high absorption at wavelength $\lambda 1$ or $\lambda 2$ (i.e., large absorbance at $\lambda 1$ or $\lambda 2$) is useful as the second photoactive ingredient.

Though either o- or p-quinonediazide may be used as the diazobenzoquinone derivative or the diazonaphthoquinone derivative, o-quinonediazide (ortho-body) is usually employed. The diazobenzoquinone derivative can be obtained by a reaction of 1,2-benzoquinone -4-sulfonyl with a hydroxyl group-containing compound, and the diazonaphthoquinone derivative can be obtained by a reaction of 1,2-naphthoquinone-4-sulfonyl or 1,2-naphthoquinone-5-sulfonyl with a hydroxyl group-containing compound.

The hydroxyl group-containing compound may be a mono- or polyhydric alcohol, or a phenol having at least one hydroxyl group. Examples of the phenol other than the above-mentioned phenols are hydroquinone; resorcin; phloroglucin; alkyl esters of gallic acid, 2,4-dihydroxybenzophenone; 2,3,4-trihydroxybenzophenone; tetrahydroxybenzophenones (e.g., 2,3,3',4-tetrahydroxybenzophenone, 2,3,4,4'-tetrahydroxybenzophenone, 2,2',4,4'-tetrahydroxybenzophenone); pentahydroxybenzophenones (e.g., 2,3,3',4,4'-pentahydroxybenzophenone, 2,3,3',4,5'-pentahydroxybenzophenone); polyhydroxytriphenyl-methanes such as tri- or tetrahydroxytriphenyl-methane [e.g., (3,4-dihydroxybenzylidene)bis(2-t-butyl-5-methoxyphenol), (3,4-dihydroxybenzylidene)bis(2-cyclohexyl-5-methoxyphenol), (3,4-dihydroxybenzylidene)bis(2-t-butyl-4-methoxyphenol), (3,4-dihydroxybenzylidene)bis(2-cyclohexyl-4-methoxyphenol)]; and polyhydroxyflavans (e.g., 2,4,4-trimethyl-2',4'7-trihydroxyflavan, 2,4,4-trimethyl -2'3'4'7,8-pentahydroxyflavan, 6-hydroxy-4a-(2,4-dihydroxyphenyl)-1,2,3,4,4a,9a-hexahydroxanthene -9-spiro-1'-cyclohexane).

An aromatic azide compound is usually used as the azide compound. Examples of the azide compound are monoazide compounds [e.g., 2,6-dichloro-4-nitro-1-azidobenzene, N-(4-azidophenyl)-N-phenylamine, N-(4-azidophenyl)-N-(4-methoxyphenyl)amine, 1-azidopyrene]; diazido compounds [e.g., 3,3'-dimethyl-4,4'-diazidobiphenyl, 3,3'-dimethoxy-4,4'-diazidobiphenyl, 4,4'-diazidodiphenylmethane, 4,4'-diazido-3,3'-dichlorodiphenylmethane, 4,4'-diazidodiphenylether, 4,4'-diazidodiphenylsulfone, 3,3'-diazidodiphenylsulfone, 4,4'-diazidodiphenylphosphide, 4,4'-diazidobenzophenone, 4,4'-diazidostilbene, 4,4'-diazidochalcone, 2,6-di(4-azidobenzal) cyclohexanone, 2,6-di(4-azidobenzal)-4-methylcyclohexanone, 2,6-di(4-azidocinnamylidene) cyclohexanone, N,N-di(4-azidophenyl)amine]; and polyazide compounds. These azide compounds can be used singly or as a combination of two or more.

Suitable as the azide compound are those efficiently generate nitrogen gas upon photoirradiation and form nitrene. For an increased crosslinking efficiency with the base resin (e.g., novolak resins, polyvinylphenol-series polymers), diazide compounds are preferable.

As the photoactive acid generator, various compounds that show large absorption at wavelength $\lambda 1$ or $\lambda 2$ (large absorbance at $\lambda 1$ or $\lambda 2$) and efficiently generate an acid (e.g., a protonic acid or a Lewis acid) upon exposure to a light of wavelength $\lambda 1$ or $\lambda 2$ are available and examples of which are sulfonic esters and Lewis acid salts that will be mentioned below.

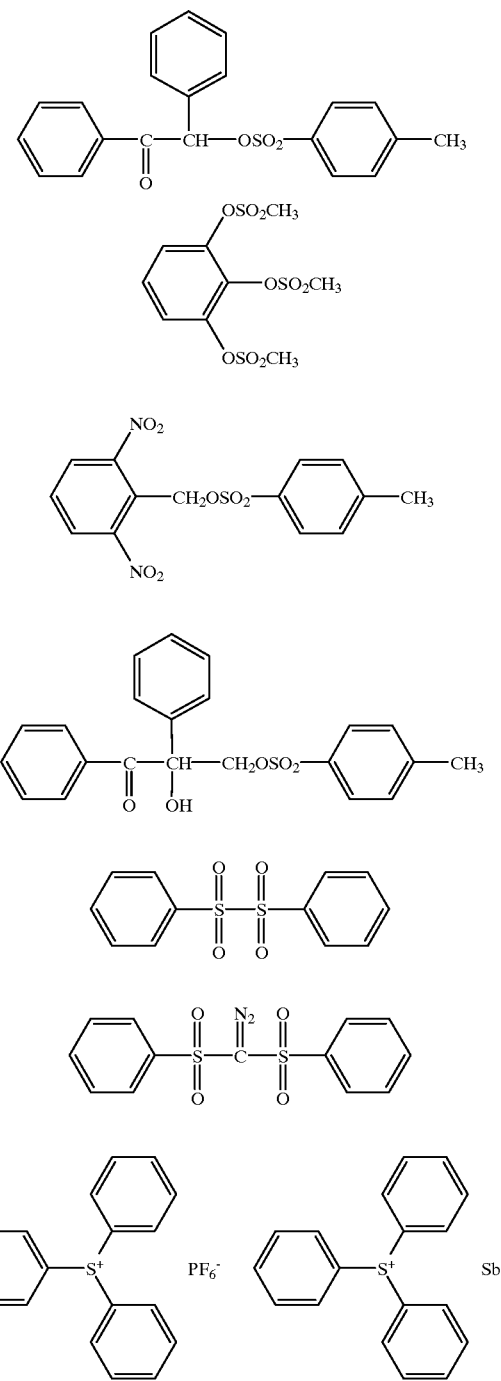

-continued

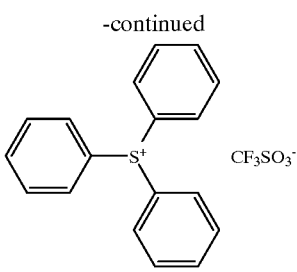

The acid generator generates an acid upon photoirradiation and accelerates the crosslinking of the base resin (e.g., in the case where a novolak resin is used as the base resin), or deprotects a protecting group upon exposure for pattern forming (e.g., in the case where the base resin is a polyvinylphenol resin) and therefore is effective for making the patterned areas of the base resin (a positive-type resin) readily alkali-soluble.

As the crosslinking agent, various crosslinking agents that accelerate the crosslinking of the base resin with the aid of an acid generated by the acid generator can be used, and examples of which are amino resins, particularly meramine derivatives. The meramine derivatives include methylolmelamines (e.g., hexamethylolmelamine); alkoxymethylmelamines (e.g., $C_{1-4}$alkoxymethylmelamines such as hexamethoxymethylmelamine); condensates thereof; and co-condensates with co-condensable components (e.g., urea, benzoguanamine).

When a polyvinylphenol-series polymer is employed as a positive-type photosensitive resin, the first photoactive ingredient can be constituted of an azide compound and the second photoactive ingredient can be constituted of a photoactive acid generator. As the azide compound and the photoactive acid generator, use can be made of the above-mentioned azide compounds and the acid generators, respectively.

The amount of the first photoactive ingredient can be selected from the range of, for example, 0.01 to 100 parts by weight (e.g., 1 to 100 parts by weight), preferably about 0.05 to 100 parts by weight (e.g., 10 to 100 parts by weight), and more preferably about 0.1 to 80 parts by weight (e.g., 20 to 80 parts by weight) relative to 100 parts by weight of the base resin, depending on the species of the base resin or that of the photoactive ingredient.

The amount of the second photoactive ingredient can be selected from the range of, for example, about 0.0001 to 10 parts by weight (e.g., 0.01 to 10 parts by weight), preferably about 0.0005 to 7 parts by weight (e.g., 0.05 to 7 parts by weight), more preferably about 0.001 to 5 parts by weight (e.g., 0.1 to 5 parts by weight), and particularly about 0.001 to 2 parts by weight relative to 100 parts by weight of the base resin, depending on the species of the base resin or that of the photoactive ingredient. For example, the amount of the azide compound is about 0.01 to 5 parts by weight, preferably about 0.05 to 3 parts by weight, and more preferably about 0.1 to 2 parts by weight (e.g., 0.1 to 1.5 parts by weight), relative to 100 parts by weight of the base resin (a novolak-series resin). The amount of the acid generator is about 0.01 to 3 parts by weight (e.g., 0.01 to 1 part by weight), preferably about 0.02 to 2 parts by weight (e.g., 0.02 to 1 part by weight), and more preferably about 0.02 to 1 part by weight (0.02 to 0.5 part by weight) relative to 100 parts by weight of the base resin. The amount of the crosslinking agent is about 0.05 to 5 parts by weight (e.g., 0.05 to 3 parts by weight) and preferably about 0.1 to 3 parts by weight (e.g., 0.1 to 1.5 parts by weight), relative to 100 parts by weight of the base resin. Moreover, when employing a polyvinylphenol-series polymer as the base resin, the amount of the azide compound is about 0.01 to 5 parts by weight (e.g., 0.05 to 3 parts by weight), preferably about 0.1 to 2 parts by weight, and more preferably about 0.1 to 1 part by weight relative to 100 parts by weight of the base resin, and the amount of the acid generator is about 0.0001 to 1 part by weight, preferably about 0.0005 to 0.1 part by weight, and more preferably about 0.001 to 0.01 part by weight.

The aforementioned photosensitive resin composition can be produced by mixing a base resin with a plurality of photoactive ingredients each having an absorption range at wavelength $\lambda1$ or $\lambda2$, the wavelengths thereof being different from each other. If an existing photosensitive resin composition already containing the first or second photoactive ingredient is to be used, what is needed to provide the photosensitive resin composition of the present invention is merely to add the second photoactive ingredient or the first photoactive ingredient thereto.

To the photosensitive resin composition may be added an alkali-soluble component such as an alkali-soluble resin, a dye, a solvent, etc. As the solvent, use can be made of, for example, hydrocarbons, halogenated hydrocarbons, alcohols, esters, ketones, ethers, cellosolves, carbitols, glycol ether esters (e.g., cellosolve acetate, propylene glycol monomethyl ether acetate), and mixed solvents thereof.

Moreover, a purified resin component previously fractionated based on, for example, the molecular weight may be used as the base resin, and from the photosensitive resin composition may be removed impurities by using a conventional separation-purification means such as filter.

According to the method of the present invention, the photosensitive resin composition is coated on a substrate (e.g., silicon wafer) and dried. Thereafter, the coating layer (resist film or layer) was exposed to a light of a wavelength of either $\lambda1$ or $\lambda2$ through a given mask to form a pattern, followed by overall-exposure to a light of the other wavelength and development. Thus, there can be formed a pattern of high resolution.

After applying the photosensitive resin composition on the substrate, the coating layer may be soft-baked with a heating means such as a hot plate at a suitable temperature (e.g., 80 to 100° C.) for a suitable period of time (e.g., 1 to 2 minutes) so that a solvent is evaporated.

For the patterning exposure (imaging exposure) or the overall exposure, lights of various wavelengths can be used according to the species of the base resin, and the light may have either a single wavelength or a compound wavelength. For the exposure, g-line (e.g., 436 nm), i-line (365 nm), excimer laser [e.g., XeCl (308 nm), KrF (248 nm), KrCl (222 nm), ArF (193 nm), and ArCl (172 nm)] can usually be employed with advantages. Examples of the preferred excimer laser include KrF, KrCl, ArF, and ArCl excimer lasers. Preferably, the imaging exposure is conducted with a light of a single wavelength, and g-line (436 nm), i-line (365 nm) or excimer laser can be used for a resist for semiconductor production. The patterning exposure or patternwise exposure can be carried out according to a conventional method, in which the exposure is done through a given mask to form a predetermined pattern. After the patternwise exposure, if needed, the pattern may be baked using a heating means such as a hot plate at a suitable temperature (e.g., 100 to 120° C.) for a suitable period of time (e.g., 1 to 2 minutes).

The exposing wavelength for pattern forming differs for the species of the base resin or the photoactive ingredients used, and the wavelength may be the shorter one ($\lambda 2$) or the longer ($\lambda 1$). Usually, when a light of the shorter wavelength is used for the imaging exposure, the overall exposure is conducted with a light of the longer wavelength. And, when a light of the longer wavelength is used for the imaging exposure, the overall exposure is mostly carried out with a light of the shorter wavelength. For example, when using a novolak resin as the base resin, the coating layer can be image-exposed to a light of wavelength $\lambda 1$, followed by an overall exposure to a light of wavelength $\lambda 2$. Moreover, when using for example a polyvinylphenol-series polymer as the base resin, the coating layer can be image-exposed to a light of wavelength $\lambda 2$, followed by an overall exposure to a light of wavelength $\lambda 1$. In either case, to form a layer hardly soluble or readily soluble in a developer (developing solution) on the surface of a photosensitive layer by overall exposure, a photoactive ingredient active at the wavelength of the light of the overall exposure is desired to be substantially inert at the wavelength of the light of the imaging exposure. Moreover, a photoactive ingredient which is activated by the light of the wavelength for the imaging exposure is preferred to be substantially inert at the wavelength of the light used for the overall exposure.

The overall exposure of the surface of the photosensitive resin composition of the present invention after the imaging exposure makes the surface of the photosensitive layer hardly soluble when the resist is of positive-type and readily soluble when the resist is of negative-type, depending on whether the resist is of positive-type or negative-type.

According to, e.g., the type of the resist to be formed and the species of the second photoactive ingredient, the energy for the overall exposure can be selected from a suitable range within which the surface can be treated so as to be hardly soluble or readily soluble of, for example, about 0.05 to 50 mJ/cm$^2$, preferably about 0.1 to 25 mJ/cm$^2$, and more preferably about 0.5 to 25 mJ/cm$^2$. Moreover, when the overall exposure is conducted using the excimer laser, the energy for the exposure can be selected from within the range of, e.g., about 0.5 to 50 mJ/cm$^2$ and preferably about 1 to 25 mJ/cm$^2$. Furthermore, in a conventional process for pattern forming in which a 20 μm-thick photosensitive layer containing no particulate is exposed and the exposed areas or non-exposed areas are dissolved with a developing agent to form a pattern (e.g., resist pattern), the exposure energy for making the surface of the photosensitive layer water-repellent or hardly soluble can be selected from the range of about 1 to 20 and preferably about 1 to 10, assuming the exposure energy needed for pattern forming (mJ/cm$^2$) to be 100. The surface can be made water-repellent or hardly or slightly soluble also by controlling the photoirradiation time or the intensity of light.

After the overall exposure, a predetermined pattern can be formed by developing according to a conventional method using a developer such as an alkaline developer. After the development, if needed, the formed pattern may be post-baked utilizing a heating means such as a hot plate at a suitable temperature (e.g., 120 to 130° C.) for a suitable period of time (e.g., 1 to 2 minutes).

According to the present invention, the resolution can be improved without employing an exposure light at a shorter wavelength. In further detail, a light for imaging exposure irradiated on a photosensitive material through a mask does not show an accurate rectangular light distribution corresponding to the mask, but is "vague" due to the diffraction and turning of the light. Thus, a pattern on a positive-type photosensitive material is made angular like a triangle. In the case of a negative-type photosensitive material, since the surface of strong light absorption is preferentially cured, a pattern is made in a T-shape. Therefore the resolution is deteriorated. In contrast, since overall exposure after patternwise exposure makes the surface of a resist layer of a positive-type photosensitive material hardly or slightly soluble, dissolution of the surface of the resist layer of strong light absorption is inhibited. In a negative-type photosensitive material, the surface of a resist layer is made readily soluble (in other words, the formation of a layer having the surface hardly soluble is inhibited), leading to an acceleration in the developability of the surface. Thus, a pattern having a rectangular cross section is formed with a pattern profile of high contrast ($\gamma$-value) and the resolution largely improved. Moreover, even when the patternwise exposure is done slightly out of focus, the above-mentioned step of making the surface of the resist layer hardly soluble or readily soluble improves the resolution, consequently resulting in a significant improvement in focus latitude.

Furthermore, according to the present invention, sensitivity also is substantially improved. To give an example, in a negative-type photosensitive material utilizing radical polymerization system for curing, inhibition of curing due to oxygen in the air is observed. However, the addition of an acid generator and a crosslinking agent as the second photoactive ingredients accelerates the curing of the surface on overall exposure, substantially improving the sensitivity. On the other hand, in a positive-type photoactive material, resolution and sensitivity are incompatible with each other. Therefore, it is usually difficult to hold both at high levels. However, since the present invention can largely improve the resolution without deteriorating the sensitivity, it can be said that the sensitivity also is substantially improved.

Furthermore, according to the present invention, the hydrophilicity and the hydrophobicity of the surface of a photosensitive material are controllable, and therefore, uniformity in development can be improved. Recently, especially in the field of resist, there is a growing trend toward making resist layers hydrophobic along with improvements in performance. Thus, the wettability with an alkaline developer is deteriorated and, particularly with a substrate having a large area, the developer hardly spreads out uniformly over the entire surface of the substrate, which results in a failure in development with uniformity. According to the present invention, however, in the case of a positive-type material in which only the exposed areas are made hydrophilic, for example, a material which generates an acid upon irradiation of a light of wavelength $\lambda 2$ is previously added and an overall exposure with a light of wavelength $\lambda 2$ is conducted to generate an acid only near the surface and make the surface hydrophilic, thereby improving the wettability of the non-exposed areas.

INDUSTRIAL APPLICABILITY

According to the present invention, since the photoactive component comprises a plurality of photoactive ingredients as a combination sensitive to lights of different wavelengths, sensitivity and resolution can largely be improved even with existing equipment (particularly, exposure system). Moreover, pattern profile and focus latitude can be improved to a large extent. Therefore, the present invention has various applications and can be used as, e.g., materials for forming circuits (e.g., resists for semiconductor production, printed-wiring boards), imaging materials (e.g., printing plate materials, materials for relief printing), and so on. Especially, for being capable of achieving high sensitivity and resolution, the present invention can advantageously be used for resists for semiconductor production.

EXAMPLES

The following examples are intended to describe the present invention in further detail and should by no means be interpreted as defining the scope of the invention.

Examples 1 to 6, and Comparative Example 1
[Preparation of Photosensitive Resin Composition]

1. Novolak resin (base resin): A novolak resin having a weight average molecular weight of 9,500 obtained by reacting meta-cresol, para-cresol, 3,5-xylenol, and formalin according to a conventional method was used.

2. Diazonaphthoquinone derivative: A diazonaphthoquinone compound was obtained by reacting a phenol compound shown by the following formula (A):

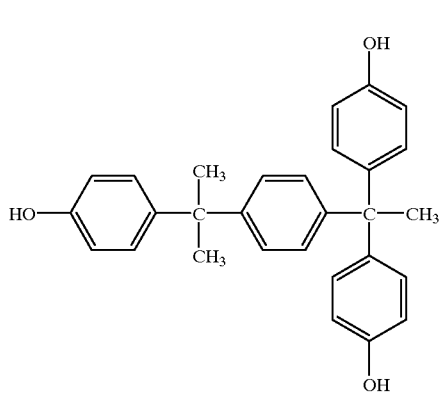

(A)

with naphthoquinone-(1,2)-diazido-(2)-5-sulfochloride in a ratio of 1:1.3 (molar ratio) in dioxane using triethylamine as a catalyst.

To a positive photoresist comprising the novolak resin (15 parts by weight), the diazonaphthoquinone compound (7 parts by weight), and propylene glycol monoethyl ether acetate as a solvent (78 parts by weight) was added a given amount of (B) 4,4'-diazidodiphenylmethane or (C) 3,3'-diazidodiphenylsulfone to prepare a photosensitive resin composition. In Table 1, the amounts of the added components (B) and (C) are expressed in terms of parts by weight, relative to 100 parts by weight of the base resin.

[Evaluation of Sensitivity, Resolution and γ (Gamma)-value]

The photosensitive resin composition was coated on a washed silicon wafer by means of a spin coater such that a resist layer of 1.1 micron in thickness after dried was formed, and the wafer was baked on a hot plate at 90° C. for 1 minute. Thereafter, the resist layer on the wafer was exposed through a mask having a line-and-space pattern with different line widths, using a reduced projection exposing machine (manufactured by Nikon Kabushiki Kaisha, NSR1755i7A, NA=0.5) having an exposing wavelength of 365 nm (i-line) with the exposure amount varied in steps. The wafer was baked at 110° C. on a hot plate for 1 minute. Further, the resist layer on the wafer was wholly exposed using an excimer laser irradiation device UER20II-222 (KrCl excimer laser, wavelength: 222 nm) manufactured by Ushio Denki Kabushiki Kaisha at an illuminance of 5 mW/cm$^2$ for a given period of time. The wafer was developed with 2.38% by weight of a tetramethylammonium hydroxide solution for 1 minute to give a positive pattern. The obtained positive pattern was evaluated in the following manner.

Sensitivity: This was expressed in terms of the exposure amount at which the 0.5 micron line-and-space pattern became 1:1.

Resolution: The minimum width of the lines formed without loss of resist layer by irradiation with a light in an amount such that the ratio of the width of the line to that of the space becomes 1:1, measured with a scanning microscope.

γ-value: The slope angle θ was measured by plotting the normalized thickness of a resist layer (the thickness of a residual resist layer/the thickness of the initial resist layer) with respect to the logarithm of exposure amount and tan θ was taken as the γ-value.

The results are shown in Table 1.

TABLE 1

| | Azide compound | | Excimer laser (KrCl) irradiation time (second) | | |
|---|---|---|---|---|---|
| | Compound | Amount added | 0 | 1 | 3 | 5 |

| Sensitivity (msec) | | | | | | |
|---|---|---|---|---|---|---|
| Example 1 | (B) | 0.3 | 200 | 130 | 130 | 140 |
| Example 2 | (B) | 0.75 | 220 | 140 | 140 | 130 |
| Example 3 | (B) | 1.5 | 250 | 180 | 160 | 150 |
| Example 4 | (C) | 0.3 | 240 | 130 | 150 | 160 |
| Example 5 | (C) | 0.75 | 280 | 140 | 140 | 160 |
| Example 6 | (C) | 1.5 | 300 | 160 | 160 | 180 |
| Com. Exam. 1 | — | — | 180 | 182 | 185 | 185 |
| Resolution (μm) | | | | | | |
| Example 1 | (B) | 0.3 | 0.50 | 0.35 | 0.35 | 0.40 |
| Example 2 | (B) | 0.75 | 0.55 | 0.35 | 0.35 | 0.35 |
| Example 3 | (B) | 1.5 | 0.55 | 0.40 | 0.35 | 0.35 |
| Example 4 | (C) | 0.3 | 0.50 | 0.35 | 0.35 | 0.40 |
| Example 5 | (C) | 0.75 | 0.55 | 0.35 | 0.35 | 0.40 |
| Example 6 | (C) | 1.5 | 0.60 | 0.40 | 0.40 | 0.45 |
| Com. Exam. 1 | — | — | 0.50 | 0.50 | 0.50 | 0.50 |
| γ-value | | | | | | |
| Example 1 | (B) | 0.3 | 1.8 | 3.0 | 2.9 | 2.4 |
| Example 2 | (B) | 0.75 | 1.6 | 2.6 | 2.8 | 2.6 |
| Example 3 | (B) | 1.5 | 1.5 | 2.4 | 2.7 | 2.5 |
| Example 4 | (C) | 0.3 | 1.8 | 2.5 | 2.4 | 2.3 |
| Example 5 | (C) | 0.75 | 1.5 | 2.7 | 2.5 | 2.3 |
| Example 6 | (C) | 1.5 | 1.3 | 2.2 | 2.3 | 2.0 |
| Com. Exam. 1 | — | — | 1.8 | 1.8 | 1.8 | 1.8 |

Examples 7 and 8

Instead of the azide compounds (B) and (C), to the positive photoresist used in Example 1 were added given amounts of an acid generator and hexamethoxymethylmelamine shown by the following formulae (D) and (E) to prepare a photosensitive resin composition. The sensitivity, resolution and γ-value of the obtained photosensitive resin composition were evaluated in the same manner as in Example 1 and the results shown in Table 2 were obtained. In Table 2, the amount of the components (D) and (E) added are expressed in terms of parts by weight, relative to 100 parts by weight of the base resin.

TABLE 2

(D) triphenylsulfonium triflate ($CF_3SO_3^-$)

(E) phenacyl p-toluenesulfonate derivative

| | | Amount of acid generator added | Amount of melamine added | Excimer laser (KrCl) irradiation time (second) | | | |
|---|---|---|---|---|---|---|---|
| | | | | 0 | 1 | 3 | 5 |
| Sensitivity (msec) | Example 7 | (D) 0.45 | 1.5 | 180 | 140 | 130 | 130 |
| | Example 8 | (E) 0.45 | 1.5 | 180 | 120 | 120 | 130 |
| Resolution ($\mu$m) | Example 7 | (D) 0.45 | 1.5 | 0.50 | 0.35 | 0.35 | 0.35 |
| | Example 8 | (E) 0.45 | 1.5 | 0.50 | 0.35 | 0.35 | 0.35 |
| $\gamma$-value | Example 7 | (D) 0.45 | 1.5 | 1.8 | 2.9 | 2.8 | 2.7 |
| | Example 8 | (E) 0.45 | 1.5 | 1.8 | 3.1 | 3.0 | 2.9 |

Examples 9 to 12, and Comparative Example 2
[Preparation of Photosensitive Resin Composition]

The acid generator (0.002 part by weight) used in Example 7 and shown by the formula (D) was added to 1 part by weight of polyvinylphenol resin having a weight average molecular weight of 7,500 in which 30 mole % of the hydroxyl group is substituted with t-BOC (t-butoxycarbonyloxy group) and mixed with 60 parts by weight of propylene glycol monomethyl ether acetate to prepare a positive photoresist.

As shown in Table 3, to the positive photoresist were added given amounts of (F) 2,6-bis(4-azidobenzal)methylcyclohexanone and (G) 2,6-bis(4-azidobenzal)cyclohexanone to prepare a photosensitive resin composition. In Table 3, the amounts of the components (F) and (G) are expressed in terms of parts by weight relative to 100 parts by weight of the base resin.

[Evaluation of Sensitivity and Resolution]

The above photosensitive resin composition was coated on a washed silicon wafer using a spin coator so that the layer after dried became 0.7 $\mu$m in thickness, and baked on a hot plate at 80° C. for 1 minute. Thereafter, the layer on the wafer was exposed through a mask having a line-and-space pattern with different line widths using a reduced projection exposing machine (manufactured by Nikon Kabushiki Kaisha, KrF excimer laser stepper, NA=0.45) having an exposing wavelength of 248 nm with the exposure amount varied in steps. The wafer was baked on a hot plate at 100° C. for 1 minute. Further, the resist layer on the wafer was wholly exposed via a blank mask using a reduced projection exposing machine (manufactured by Nikon Kabushiki Kaisha, NSR1755i 7A, NA=0.5) having an exposing wavelength of 365 nm (i-line) for a given period of time. Thereafter, the resist layer was paddle-developed with 2.38% by weight of a tetramethylammonium hydroxide solution for 1 minute to give a positive pattern.

The positive pattern was evaluated according in the following manner.

Sensitivity: This was expressed in terms of the exposure amount at which the 0.4 micron line-and-space pattern became 1:1, measured with a scanning microscope.

Resolution: The minimum width of the lines formed without loss of resist layer by irradiation with a light in an amount such that the ratio of the width of the line to that of the space becomes 1:1.

The results are shown in Table 3.

TABLE 3

| | Azide compound | | i-line irradiation time (msec) | | | |
|---|---|---|---|---|---|---|
| | Compound | Amount added | 0 | 50 | 100 | 150 |
| Sensitivity (msec) | | | | | | |
| Example 9 | (F) | 0.3 | 70 | 50 | 50 | 55 |
| Example 10 | (F) | 0.6 | 80 | 55 | 55 | 55 |
| Example 11 | (G) | 0.3 | 72 | 49 | 48 | 51 |
| Example 12 | (G) | 0.6 | 85 | 51 | 50 | 51 |
| Com. Exam. 2 | — | — | 65 | 65 | 65 | 65 |
| Resolution ($\mu$m) | | | | | | |
| Example 9 | (F) | 0.3 | 0.30 | 0.23 | 0.21 | 0.22 |
| Example 10 | (F) | 0.6 | 0.32 | 0.23 | 0.22 | 0.23 |
| Example 11 | (G) | 0.3 | 0.30 | 0.23 | 0.21 | 0.22 |
| Example 12 | (G) | 0.6 | 0.32 | 0.23 | 0.22 | 0.23 |
| Com. Exam. 2 | — | — | 0.30 | 0.30 | 0.30 | 0.30 |

What is claimed is:

1. A positive photosensitive resin composition, comprising:
   a base resin selected from the group consisting of polyvinylphenol polymers and polymers having non-aromatic ring structures;
   a photoactive azide compound responsive to light of an absorption wavelength $\lambda 1$;
   a photoactive acid generator responsive to light of an absorption wavelength $\lambda 2$; and
   optionally, one or more components selected from the group consisting of an alkali-soluble resin, a dye, and a solvent; wherein $\lambda 1$ is greater than $\lambda 2$.

2. The positive photosensitive resin composition of claim 1, wherein the difference between the absorption wavelength $\lambda 1$ of the photoactive azide and the absorption wavelength $\lambda 2$ of the photoactive acid generator is 30 to 450 nm.

3. The positive photosensitive resin composition of claim 2, wherein the absorption wavelength $\lambda 1$ is 320 to 530 nm and the absorption wavelength $\lambda 2$ is 120 to 320 nm.

4. The positive photosensitive resin composition of claim 1, wherein the photoactive acid generator is at least one member selected from the group consisting of a sulfonic ester and a Lewis acid salt and is a compound which generates an acid upon exposure to light of the absorption wavelength $\lambda 2$.

5. The positive photosensitive resin composition of claim 1, wherein the photoactive azide compound is an aromatic azide compound.

6. The positive photosensitive resin composition of claim 1, comprising 0.01 to 100 parts by weight of the photoactive azide compound and 0.0001 to 10 parts by weight of the photoactive acid generator, relative to 100 parts by weight of the base resin.

7. A method for forming patterns, comprising, in order:
providing a photosensitive resin composition according to claim 1;
exposing the photosensitive resin composition to light of the wavelength $\lambda 2$ to form a pattern;
exposing the entire surface of the photosensitive resin composition to light of the wavelength $\lambda 1$; and
developing the exposed photosensitive resin composition.

8. The method of claim 7, wherein the entire surface of the photosensitive resin composition is made to be readily soluble in a developer by said exposing the entire surface.

9. The method of claim 7, wherein the molecular extinction coefficient of the photoactive azide compound is $1 \times 10^3$ to $5 \times 10^5$.

10. The method of claim 7, wherein an energy level employed for said exposing the entire surface is 0.05 to 50 mJ/cm$^2$.

11. The method of claim 7, wherein an energy level employed for said exposing the entire surface is 1 to 20% of an energy level employed for said exposing the photosensitive resin composition to form a pattern.

12. A method for forming patterns, comprising, in order:
providing a photosensitive resin composition which comprises a base resin and a photoactive component, the photoactive component including a plurality of photoactive ingredients each having an absorption range at wavelength $\lambda 1$ or $\lambda 2$, the base resin containing novolak resin and the photoactive component containing at least a quinonediazide;
exposing the photosensitive resin composition to light of the wavelength $\lambda 1$ to form a pattern;
exposing the entire surface of the photosensitive resin composition to light of the wavelength $\lambda 2$; and
developing the exposed photosensitive resin composition;
wherein $\lambda 1$ is greater than $\lambda 2$.

13. The method of claim 12, wherein the entire surface of the photosensitive resin composition is made to be readily soluble in a developer by said exposing the entire surface.

14. The method of claim 12, wherein the molecular extinction coefficient of a photoactive ingredient which is activated by a light used for said exposing the entire surface is $1 \times 10^3$ to $5 \times 10^5$.

15. The method of claim 12, wherein an energy level employed for said exposing the entire surface is 0.05 to 50 mJ/cm$^2$.

16. The method of claim 12, wherein an energy level employed for said exposing the entire surface is 1 to 20% of the energy for said exposing the photosensitive resin composition to form a pattern.

17. The method of claim 12, wherein the wavelength $\lambda 1$ is in the range of 320 to 530 nm and the wavelength $\lambda 2$ is in the range of 100 to 350 nm or 120 to 320 nm.

* * * * *